United States Patent
Kobayashi et al.

(10) Patent No.: US 8,598,769 B2
(45) Date of Patent: Dec. 3, 2013

(54) PEROVSKITE OXIDE MATERIAL, FERROELECTRIC COMPOUND, PIEZOELECTRIC BODY, PIEZOELECTRIC DEVICE, AND LIQUID DISCHARGE DEVICE

(75) Inventors: Hiroyuki Kobayashi, Ashigarakami-gun (JP); Yukio Sakashita, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 681 days.

(21) Appl. No.: 12/832,564

(22) Filed: Jul. 8, 2010

(65) Prior Publication Data

US 2011/0007115 A1   Jan. 13, 2011

(30) Foreign Application Priority Data

Jul. 9, 2009   (JP) ................................. 2009-162423

(51) Int. Cl.
   *H01L 41/04*   (2006.01)

(52) U.S. Cl.
   USPC ....................... 310/358; 347/68; 252/62.9 PZ

(58) Field of Classification Search
   CPC .................................................... H01L 41/187
   USPC ....................... 310/358; 347/68; 252/62.9 PZ
   See application file for complete search history.

(56) References Cited

U.S. PATENT DOCUMENTS

| | | | |
|---|---|---|---|
| 4,624,796 A | 11/1986 | Giniewicz et al. | |
| 2005/0190454 A1* | 9/2005 | Shinoda | ........................ 359/642 |
| 2007/0241642 A1 | 10/2007 | Miyazawa et al. | |
| 2008/0074471 A1 | 3/2008 | Sakashita et al. | |
| 2008/0265718 A1 | 10/2008 | Sakashita et al. | |
| 2008/0278038 A1 | 11/2008 | Kobayashi et al. | |
| 2009/0072673 A1* | 3/2009 | Fujii et al. | ...................... 310/358 |
| 2009/0267998 A1 | 10/2009 | Sakashita et al. | |
| 2010/0103226 A1* | 4/2010 | Sakashita et al. | ............... 347/68 |

FOREIGN PATENT DOCUMENTS

| | | |
|---|---|---|
| DE | 218 087 A1 | 1/1985 |
| EP | 1 950 188 A1 | 7/2008 |
| EP | 2 145 975 A2 | 1/2010 |
| JP | 2002/321975 A | 11/2002 |
| JP | 2005/047745 A | 2/2005 |
| JP | 2007221066 A | 8/2007 |
| JP | 2008/098627 A | 4/2008 |
| JP | 2008/263158 A | 10/2008 |
| WO | 2008/088086 A1 | 7/2008 |

OTHER PUBLICATIONS

Wang et al., "Epitaxial $BiFeO_3$ Multiferroic Thin Film Heterostructures," www.sciencemag.org, Science vol. 299, pp. 1719-1722, Mar. 14, 2003.

(Continued)

*Primary Examiner* — Derek Rosenau
*Assistant Examiner* — Bryan Gordon
(74) *Attorney, Agent, or Firm* — Sughrue Mion, PLLC

(57) ABSTRACT

A perovskite oxide material containing: $BiFeO_3$ as a first component; a second component containing at least one perovskite oxide which is constituted by A-site atoms having an average ionic valence of two and has a tendency to form a tetragonal structure; and a third component containing at least one perovskite oxide which has a tendency to form one of monoclinic, triclinic, and orthorhombic structures; where each perovskite oxide in the first component, the second component, and the third component contains A-site atoms, B-site atoms, and oxygen atoms substantially in a molar ratio of 1:1:3, and the molar ratio can deviate from 1:1:3 within a range.

20 Claims, 6 Drawing Sheets

(56) References Cited

OTHER PUBLICATIONS

Yun et al., "Giant Ferroelectric Polarization Beyond 150μC/cm² in BiFeO₃ Thin Film," The Japan Society of Applied Physics, vol. 43, No. 5A, pp. L647-L648, 2004.
Robert S. Roth, "Classification of Perovskite and Other ABO₃-Type Compounds," Journal of Research of the National Bureau of Standards, vol. 58, No. 2, Research Paper 2736, pp. 75-88, Feb. 1957.
R.D. Shannon, "Revised Effective Ionic Radii and Systematic Studies of Interatomic Distances in Halides and Chalcogenides," Central Research and Development Department, Experimental Station, E.I. Dupont de Nemours and Company, Acta Cryst, A 32, pp. 751-767, 1976.
Kimura at al., "Magnetic Control of Ferroelectric Polarization," Nature Publishing Group, Nature. vol. 426, pp. 55-58, 2003.
Grizalez et al., "Occurrence of Ferroelectricity in Epitaxial BiMnO₃ Thin Films," Microelectronics Journal, vol. 39, pp. 1308-1310, 2008.
Extended European Search Report corresponding to Application No. 10168825.7, dated Dec. 3, 2010.
Naoyuki Itoh et al., "Fabrication and Characterization of BiFeO₃-BaTiO₃ Ceramics by Solid State Reaction", Ferroelectrics, EcoTopia Science Institute, 2007, 356, pp. 19-23, Nagoya University, Furocho, Chikusa-ku, Nagoya, Japan.
Database WPI Week 200865, Thomson Scientific , XP-002607081, Univ Tongji, London, Sep. 3, 2008, London, GB.
Database WPI Week, Thomson Scientific, XP-002607082, Univ Guilin Electronic Sci & Technology, Aug. 6, 2008, London, GB.
Jeong Seog Kim et al., Ferroelectric and ferromagnetic properties of $0.2BiFeO_3$—$0.2RFeO_3$—$0.6ATiO_3$ (R=Pr, Nd and A=Ba, Pb) and $0.8BiFeO_{3-0.2BaTiO3}$, Journal of the European Ceramic Society 24 (2004), pp. 1551-1555, Department of Materials Science and Engineering, Hoseo University, Chungnam, South Korea.

* cited by examiner

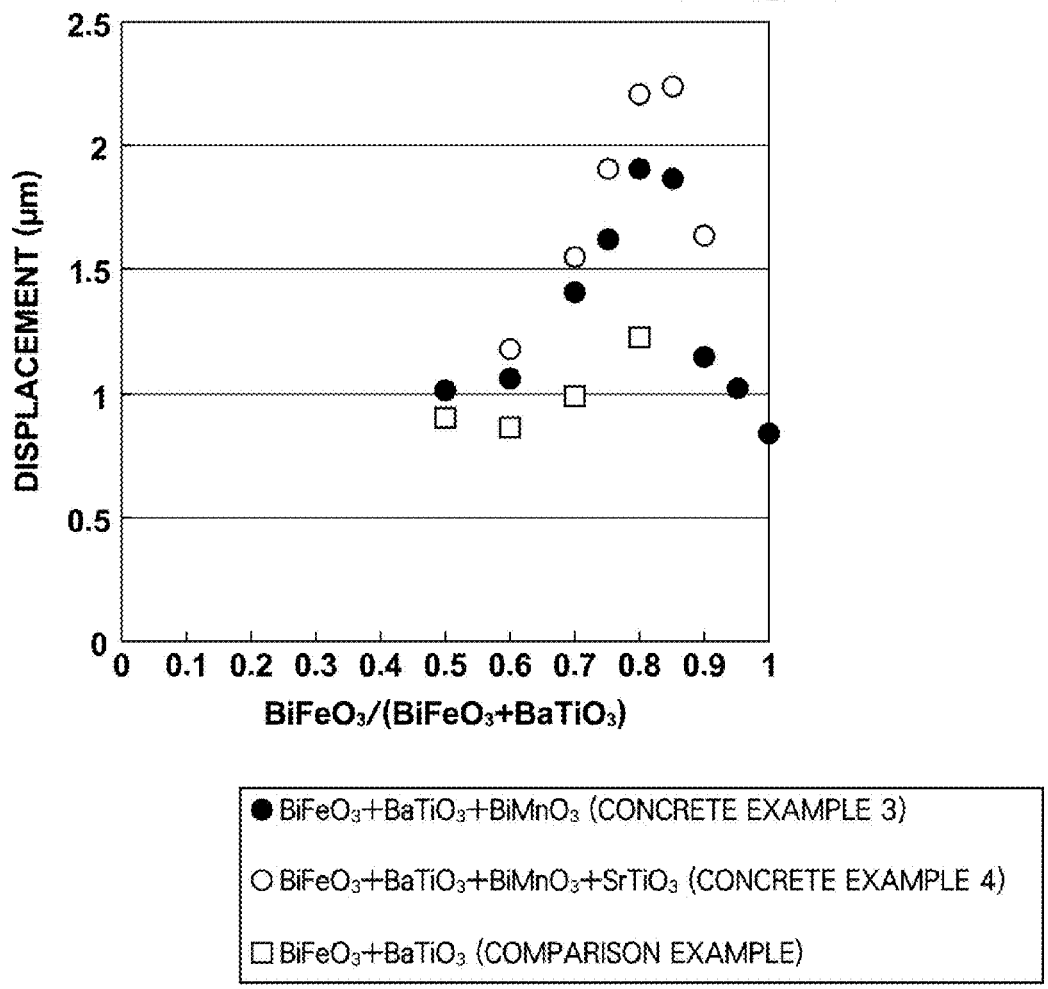

PEROVSKITE OXIDE MATERIAL, FERROELECTRIC COMPOUND, PIEZOELECTRIC BODY, PIEZOELECTRIC DEVICE, AND LIQUID DISCHARGE DEVICE

BACKGROUND OF THE INVENTION

1. Field of the Invention

The present invention relates to a perovskite oxide material, a ferroelectric compound containing the perovskite oxide, a piezoelectric body formed of the perovskite oxide, a piezoelectric device using the piezoelectric body, and a liquid discharge device using the piezoelectric device.

2. Description of the Related Art

Currently, the piezoelectric devices constituted by a piezoelectric body and electrodes are used, for example, as piezoelectric actuators installed in inkjet recording heads. In such piezoelectric devices, the piezoelectric body expands and contracts in response to increase and decrease in the strength of an electric field applied from the electrodes to the piezoelectric body. For example, the perovskite oxides such as PZT (lead titanate zirconate) are known as materials suitable for the piezoelectric body. The piezoelectric materials are ferroelectric materials, which exhibit spontaneous polarization even when no electric field is applied.

Incidentally, in consideration of the environmental load, the lead content of the perovskite oxide is preferably small, and more preferably zero. Therefore, development of new lead-free perovskite oxides exhibiting higher piezoelectric performance is proceeding.

Japanese Unexamined Patent Publication No. 2005-047745 (hereinafter referred to as JP2005-047745) discloses, in its claim 1, a piezoelectric ceramic containing first, second, and third compounds, where the first compound has a rhombohedral perovskite structure, the second compound has a tetragonal perovskite structure and contains barium titanate, and the third compound contains at least one of the bivalent metal elements of Bi, Mg, Fe, Co, Ni, Cu, and Zn, at least one of the tetrad metal elements of Ti, Zr, and Sn, and oxygen. In addition, JP2005-047745 discloses, in its claim 3, bismuth sodium titanate as the first compound.

Japanese Unexamined Patent Publication No. 2002-321975 (hereinafter referred to as JP2002-321975) discloses, in its claim 1, a piezoelectric ceramic containing a compound having a rhombohedral perovskite structure, a compound having a tetragonal perovskite structure, and a compound having a monoclinic perovskite structure. In addition, JP2002-321975 discloses, in its claim 6, a concrete composition of the piezoelectric ceramic containing first, second, and third oxides, where the first oxide contains bismuth sodium titanate, the second oxide contains at least one of bismuth potassium titanate and barium titanate, and the third compound contains silver niobate.

Japanese Unexamined Patent Publication No. 2008-098627 (hereinafter referred to as JP2008-098627) discloses, in its claim 1, a piezoelectric device containing a piezoelectric body formed of a perovskite oxide expressed by a compositional formula, (Bi, Ba) (M, Ti)$O_3$, where M represents one of or a combination of ones of the elements Mn, Cr, Cu, Sc, In, Ga, Yb, Al, Mg, Zn, Co, Zr, Sn, Nb, Ta, and W. In addition, JP2008-098627 discloses, in its claim 5, a piezoelectric device containing a piezoelectric body formed of a perovskite oxide expressed by a compositional formula (Bi, Ba) (M', M", Cu)$O_3$, where M' represents one of the elements Nb, Ta, and W, and M" represents one of or a combination of ones of the elements Mn, Sc, In, Ga, Yb, Al, Mg, Zn, Zr, Fe, and Sn. Further, JP2008-098627 discloses, in its claims 3 and 7, a crystal structure of the piezoelectric body in which at least two of the tetragonal, rhombohedral, pseudo cubic, orthorhombic, and monoclinic crystal phases are mixed.

Japanese Unexamined Patent Publication No. 2008-263158 (hereinafter referred to as JP2008-263158) discloses, in its claim 1, a piezoelectric device containing a piezoelectric body formed of a ABO$_3$ perovskite oxide composed of Bi as the A-site element and two B-site elements, and at least two of the tetragonal, rhombohedral, pseudo cubic, orthorhombic, and monoclinic crystal phases are mixed in the ABO$_3$ perovskite oxide. In addition, JP2008-263158 discloses, in its claim 2, a composition of the ABO$_3$ perovskite oxide, which contains BiCoO$_3$ as a constituent, and at least one of the elements Sc, Al, Mn, Cr, Cu, Ga, In, Yb, Mg, Zn, Zr, Sn, Ti, Nb, Ta, and W as at least one other B-site element. Further, JP2008-263158 discloses, in its claim 3, a composition of the ABO$_3$ perovskite oxide, which contains BiInO$_3$ as a constituent, and at least one of the elements Sc, Al, Mn, Fe, Cr, Cu, Ga, Yb, Mg, Zn, Zr, Sn, Ti, Nb, Ta, and W as at least one other B-site element.

The conventional piezoelectric devices commonly use the field-induced strain (i.e., the piezoelectric strain along the direction of the spontaneous polarization axis) caused by application of an electric field along the direction of the spontaneous polarization axis. (That is, the direction of the applied electric field is identical to the direction of the spontaneous-polarization axis.) However, the magnitude of strain produced by only the conventional field-induced strain is limited, and therefore demands for a greater magnitude of strain have been increasing.

A group including one of the present inventors Yukio Sakashita discloses, in U.S. Patent Application Publication Nos. 20090267998 and 20080265718 (which are hereinafter respectively referred to as US20090267998 and US20080265718) and other documents, piezoelectric devices each constituted by a piezoelectric body having domains the phases of which can transition to different phases when an electric field is applied to the piezoelectric body in a direction different from the direction of the spontaneous-polarization axis. Further, the present inventors disclose, in U.S. Patent Application Publication No. 20080074471 (hereinafter referred to as US20080074471) and other documents, a piezoelectric device constituted by a piezoelectric body having domains the polarization axes of which can be reversibly rotated by a non-180-degree angle by increasing or decreasing the electric field applied to the piezoelectric body in the direction different from the direction of the spontaneous-polarization axis.

In the systems in which the field-induced strain and/or the reversible non-180-degree domain rotation can occur, a piezoelectric strain greater than the conventional field-induced strain can be achieved in the direction of the spontaneous-polarization axis when an electric field is applied along the direction of the spontaneous-polarization axis. In such systems, a great magnitude of strain can be achieved even at a relatively low strength of the electric field.

Further, JP2008-263158 states in its paragraph 0041: "It is preferable that the tetragonal crystal and at least one of the rhombohedral, pseudo cubic, orthorhombic, and monoclinic crystals are mixed in the piezoelectric body. In the case where a piezoelectric body having the above crystal configuration contains (100)-oriented domains, the (100) orientation can be changed to the (001) or (010) orientation by applying an electric field to the piezoelectric body, so that high piezoelectric performance can be achieved."

SUMMARY OF THE INVENTION

The present invention has been made in view of the above circumstances.

The first object of the present invention is to provide a lead-free or low-lead perovskite oxide material in which the field-induced strain and/or the reversible non-180-degree domain rotation can easily occur, and which can form a piezoelectric body superior in piezoelectric (ferroelectric) performance.

The second object of the present invention is to provide a ferroelectric compound containing the lead-free or low-lead perovskite oxide material which achieves the first object.

The third object of the present invention is to provide a piezoelectric body formed of the lead-free or low-lead perovskite oxide material which achieves the first object.

The fourth object of the present invention is to provide a piezoelectric device using the piezoelectric body which achieves the third object.

The fifth object of the present invention is to provide a liquid discharge device using the piezoelectric device which achieves the fourth object.

In order to accomplish the first object, a perovskite oxide material according to the first aspect of the present invention is provided. The perovskite oxide material according to the first aspect of the present invention contains: $BiFeO_3$ as a first component; a second component containing at least one perovskite oxide which is constituted by A-site atoms having an average ionic valence of two and has a tendency to form a tetragonal structure; and a third component containing at least one perovskite oxide which has a tendency to form one of the monoclinic, triclinic, and orthorhombic structures; where each perovskite oxide in the first component, the second component, and the third component contains A-site atoms, B-site atoms, and oxygen atoms substantially in a molar ratio of 1:1:3, and the molar ratio can deviate from 1:1:3 within a range in which the each perovskite oxide can have a perovskite structure.

The crystal system of $BiFeO_3$ as the first component is the rhombohedral system.

In this specification, the expression such as "a component has a tendency to form a specific crystal structure" or "a component has a tendency to form a crystal structure belonging to a specific crystal system" means that the component forms the specific crystal structure (or a crystal structure belonging to the specific crystal system) when no other component exists. Therefore, in the perovskite oxide material according to the first aspect of the present invention, each of the first, second, and third components may or may not actually form the crystal structure the tendency to which is indicated in the above description defining the first aspect of the present invention since the three components exist in the perovskite oxide material according to the first aspect of the present invention.

The phase configuration of the perovskite oxide material according to the first aspect of the present invention is not specifically limited. For example, in the perovskite oxide material according to the first aspect of the present invention, the first, second, and third components may coexist to form a mixed crystal structure constituted by three or more phases, or two or more of the three components are solid-solved into a single phase, or the first, second, and third components may form other phase configuration.

For example, in the case where the composition of the perovskite oxide material is near an MPB (morphotropic phase boundary), it is difficult to analyze which crystal system the crystal structure actually formed by each component in the perovskite oxide material belongs to. Further, it is possible to consider that each of the first, second, and third components may not actually form the crystal structure belonging to the crystal system the tendency to which is indicated in the above description defining the first aspect of the present invention.

In order to accomplish the second object, a ferroelectric compound according to the second aspect of the present invention is provided. The ferroelectric compound according to the second aspect of the present invention is characterized in containing the perovskite oxide material according to the first aspect of the present invention.

In order to accomplish the third object, a piezoelectric body according to the third aspect of the present invention is provided. The piezoelectric body according to the third aspect of the present invention is characterized in being formed of the perovskite oxide material according to the first aspect of the present invention.

In order to accomplish the fourth object, a piezoelectric device according to the fourth aspect of the present invention is provided. The piezoelectric device according to the fourth aspect of the present invention is characterized in comprising the piezoelectric body according to the third aspect of the present invention, and electrodes through which an electric field can be applied to the piezoelectric body.

In order to accomplish the fifth object, a liquid discharge device according to the fifth aspect of the present invention is provided. The liquid discharge device according to the fourth aspect of the present invention is characterized in comprising the piezoelectric body according to the third aspect of the present invention, and a discharge member arranged adjacent to the piezoelectric device. The discharge member includes a liquid-reserve chamber which reserves liquid, and a liquid-discharge outlet arranged to externally discharge the liquid in response to application of an electric field to the piezoelectric body in the piezoelectric device. In the above description of the liquid discharge device, the expression "the discharge member arranged adjacent to the piezoelectric device" means to include a discharge member all or part of which is integrally formed with the piezoelectric device. For example, in the case where the piezoelectric body and the electrodes are formed on a substrate, the liquid-reserve chamber and the liquid-discharge outlet may be formed integrally with the substrate.

The present inventors have investigated the domain configurations (in particular, in lead-free perovskite oxides) in which the field-induced strain and/or the reversible non-180-degree domain rotation can easily occur, and made the present invention by improving the compositions on the basis of the investigation. Although lead-free perovskite oxide materials can be produced according to the present invention, generally, the perovskite oxide materials according to the present invention may contain lead. However, even in the case where the perovskite oxide materials according to the present invention contain lead, the lead content in the perovskite oxide materials according to the present invention can be reduced to a level lower than the lead content in the conventional lead-containing perovskite oxides such as PZT (lead titanate zirconate). That is, the present invention enables reduction in the lead content.

According to the present invention, it is possible to provide a lead-free or low-lead perovskite oxide material in which the field-induced strain and/or the reversible non-180-degree domain rotation can easily occur, and which can form a piezoelectric body superior in piezoelectric (ferroelectric) performance. In the case where a piezoelectric body is formed of the perovskite oxide material according to (the first aspect of) the present invention, the piezoelectric body can achieve a great piezoelectric strain even at relatively low electric field strength, since the field-induced strain and/or the reversible non-180-degree domain rotation can easily occur in the piezoelectric body.

BRIEF DESCRIPTION OF THE DRAWINGS

FIG. 7 is graph indicating a relationship between the composition and the displacement in each of the concrete examples 3 and 4 and a comparison example.

DETAILED DESCRIPTION OF THE INVENTION

Figure 1:
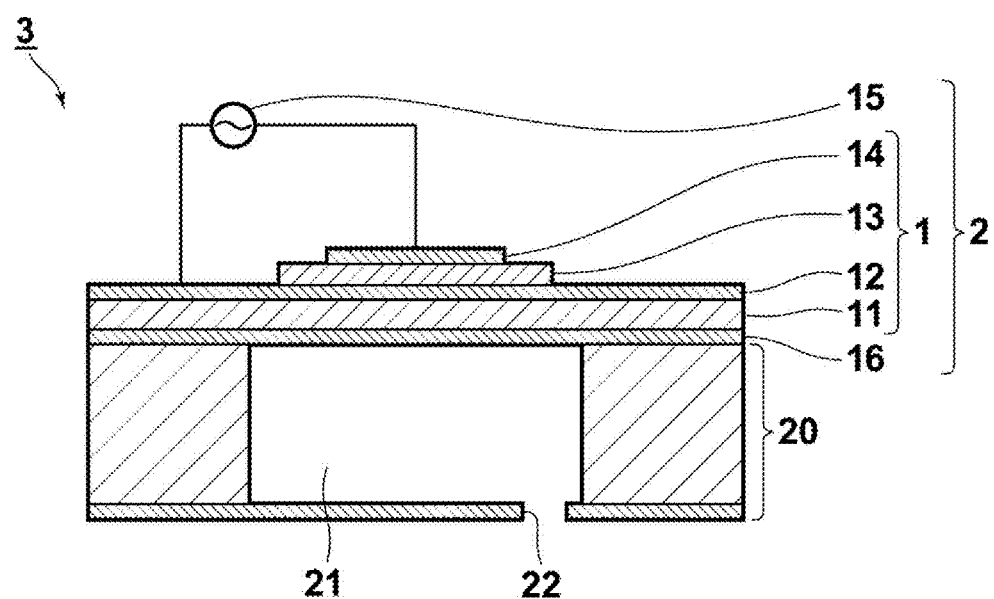
FIG. 1 is a cross-sectional view schematically illustrating a cross section of an essential portion of an inkjet recording head (as a liquid discharge device) having a piezoelectric device according to an embodiment of the present invention.

Preferred embodiments of the present invention are explained in detail below with reference to drawings.

1. Perovskite-Oxide Material

As described before, the perovskite oxide material according to the first aspect of the present invention contains: $BiFeO_3$ as a first component; a second component containing at least one perovskite oxide which is constituted by A-site atoms having an average ionic valence of two and has a tendency to form a tetragonal structure; and a third component containing at least one perovskite oxide which has a tendency to form one of monoclinic, triclinic, and orthorhombic structures; where each perovskite oxide in the first component, the second component, and the third component contains A-site atoms, B-site atoms, and oxygen atoms substantially in a molar ratio of 1:1:3, and the molar ratio can deviate from 1:1:3 within a range in which the each perovskite oxide can have a perovskite structure.

As described before in the "SUMMARY OF THE INVENTION," in this specification, the expression such as "a component has a tendency to form a specific crystal structure" or "a component has a tendency to form a crystal structure belonging to a specific crystal system" means that the component forms a specific crystal structure (or a crystal structure belonging to the specific crystal system) when no other component exists. Therefore, in the perovskite oxide material according to the first aspect of the present invention, each of the first, second, and third components may or may not actually form the crystal structure the tendency to which is indicated in the above description defining the first aspect of the present invention.

Incidentally, it is known that the composition ranges and crystal systems of perovskite compounds which are expressed by a general chemical compositional formula $ABO_3$ and can realize a perovskite structure can be predicted on the basis of the tolerance factor TF. (For example, see "Classification of perovskite and other $ABO_3$-type compounds", R. S. Roth, Journal of Research of the National Bureau of Standards, Vol. 58, RP 2736, 1957.) The tolerance factor TF is defined as $$TF=(rA+rO)/\sqrt{2}(rB+rO),$$

where rA is the average ionic radius of one or more A-site elements, rB is the average ionic radius of one or more B-site elements, and rO is the ionic radius of the oxygen ion. In this specification, the ionic radius is the Shannon ionic radius. (See "Revised Effective Ionic Radii and Systematic Studies of Interatomic Distances in Halides and Chalcogenides", R. D. Shannon, Acta Cryst., Vol. A32, pp. 751-767, 1976.) The average ionic radius is expressed by $\Sigma CiRi$, where Ci indicates the mole fraction of each ion in a lattice site, and Ri is the ionic radius of the ion.

When the tolerance factor TF is equal to 1.0, the crystal lattice of the perovskite structure has the closest packed structure. The B-site atoms hardly move in the crystal lattice under this condition, so that the perovskite oxides tend to have a stable structure under this condition. When the perovskite oxide has such a composition as to realize the above condition, the perovskite oxide tends to have a crystal structure such as the cubic or pseudo cubic structure, and does not exhibit ferroelectricity, or exhibits very low ferroelectricity.

When the tolerance factor TF is greater than 1.0, the B-site ions are smaller than the A-site atoms. Under this condition, the B-site atoms can easily enter the crystal lattice even when the crystal lattice is not distorted, and easily move in the crystal lattice. When the perovskite oxide has such a composition as to realize the above condition, the perovskite oxide tend to have a crystal structure such as the tetragonal crystal (in which the spontaneous polarization axis is oriented along the <001> direction), and exhibits ferroelectricity. There is a tendency that the ferroelectricity becomes higher when the difference of the tolerance factor from 1.0 increases.

When the tolerance factor TF is smaller than 1.0, the B-site atoms are greater than the A-site atoms. Under this condition, the B-site atoms do not enter the crystal lattice unless the crystal lattice is distorted. When the perovskite oxide has such a composition as to realize the above condition, the perovskite oxide tends to have a crystal structure such as the orthorhombic crystal (in which the spontaneous polarization axis is oriented along the <101> direction) or the rhombohedral crystal (in which the spontaneous polarization axis is oriented along the <111> direction), and exhibits ferroelectricity. There is a tendency that the ferroelectricity becomes higher when the difference of the tolerance factor from 1.0 increases.

For example, when a map indicating the relationship between the ionic radii of the A-site ion and the B-site ion and the tolerance factor TF as indicated in FIG. 1 in U.S. Patent Application Publication No. 20080278038 (hereinafter referred to as US20080278038) is produced, it is possible to design the composition of the first, second, and third components so as to realize desired crystal systems. (The inventors of US20080278038 include one of the present inventor, Yukio Sakashita.)

Recently, there has been a tendency that the TF values for the perovskite oxides containing Bi are lowly estimated. According to the investigations made by the present inventors, it has been clarified that the relationship between the TF value and the crystal system fits well to the experimental data when the TF value is estimated by using the covalent radius (instead of the ionic radius) of Bi. That is, it is preferable to estimate the TF value by using the covalent radius, instead of the ionic radius, as for Bi. In addition, the Shannon ionic radii are not available for all the valences. Therefore, when the TF values are estimated, the known ionic radii are used for the valences for which the Shannon ionic radii are not available.

The crystal structure which the first component $BiFeO_3$ tends to form is the rhombohedral (R) structure. The spontaneous-polarization axis of the rhombohedral crystal is oriented in the <111> direction.

The second component contains at least one perovskite oxide which is constituted by A-site atoms having an average ionic valence of two and has a tendency to form a tetragonal structure. The spontaneous-polarization axis of the tetragonal crystal is oriented in the <001> direction. The A-site elements in the second component may be a combination of one or more bivalent elements, or a combination of a plurality of nonbivalent elements realizing the average ionic valence of two (e.g., a combination of one or more univalent elements and one or more trivalent elements), or a combination of a plurality of elements which include one or more bivalent elements and one or more nonbivalent elements realizing the average ionic valence of two (e.g., a combination of one or more bivalent elements, one or more univalent elements, and one or more trivalent elements).

The B-site element or elements constituting the second component are not specifically limited. However, in consideration of the valence balance, it is preferable that the second component be constituted by one or more +2/+4 type perovskite oxides, in which the average ionic valence of the A-site element is two and the average ionic valence of the B-site element is four. The B-site element or elements constituting the second component may be a combination of one or more quadrivalent elements, or a combination of a plurality of nonquadrivalent elements realizing the average ionic valence of four (e.g., a combination of one or more trivalent elements and one or more pentavalent elements), or a combination of a plurality of elements which include one or more quadrivalent elements and one or more nonquadrivalent elements realizing the average ionic valence of four (e.g., a combination of one or more trivalent elements, one or more quadrivalent elements, and one or more pentavalent elements).

It is preferable that the second component contains at least one of $BaTiO_3$, (Bi, K) $TiO_3$, and $SnTiO_3$, and it is particularly preferable that the second component contain $BaTiO_3$.

The third component contains at least one perovskite oxide which has a tendency to form one of monoclinic, triclinic, and orthorhombic structures. The spontaneous-polarization axes of the monoclinic, triclinic, and orthorhombic crystals are oriented in the <101> direction. The spontaneous-polarization axes of the crystals constituting the third component are oriented in the direction between the <001> direction of the spontaneous-polarization axis of the tetragonal crystal and the <111> direction of the spontaneous-polarization axis of the rhombohedral crystal.

It is preferable that the third component contain at least one of $RMnO_3$, $BiMnO_3$, $CaTiO_3$, and $BiCrO_3$, where R denotes at least one of Sm, Eu, Gd, Tb, La, and Nd. It is particularly preferable that the third component contain $BiMnO_3$. In the third component, $RMnO_3$ tends to form an orthorhombic structure. Some textbooks indicate that $BiMnO_3$ tends to form a monoclinic structure, and some other textbooks indicate that $BiMnO_3$ tends to form a trigonal structure.

$BiCrO_3$ tends to form a orthorhombic structure. However, some textbooks indicate that $BiCrO_3$ tends to form monoclinic structure, and some other textbooks indicate that $CaTiO_3$ and $BiCrO_3$ tend to form a trigonal structure.

It is more preferable that the third component forms at least one of a monoclinic structure and a triclinic structure.

It has been conventionally said that PZT (lead titanate zirconate), which is a solid solution of PbTiO3 (PT) and PbZrO3 (PZ), exhibits high piezoelectric performance at or near the MPB (morphotropic phase boundary). PZT tends to form a tetragonal structure when the proportion of Ti is great, and tends to form a rhombohedral structure when the proportion of Zr is great. When the molar ratio of Zr to Ti is approximately one, PZT is at the MPB. Specifically, it is said that PZT exhibits high piezoelectric performance at the molar ratio of Zr to Ti of 52/48, at which PZT is near the MPB. Although it has been conventionally said that PZT tends to form a pseudo cubic structure at or near the MPB, details of the nanostructure have not yet been clarified.

In other words, the perovskite oxide material according to the present invention has the composition which is realized by adding a third component to a two-component system (e.g., PZT) (which is formed with tetragonal crystals and rhombohedral crystals), where the third component contains a crystal structure having a spontaneous-polarization axis oriented in the direction between the spontaneous-polarization axes of the tetragonal crystal and rhombohedral crystal.

In the case where a piezoelectric body is formed of the perovskite oxide material according to the present invention, the piezoelectric body can contain a ferroelectric phase having crystal orientation along a direction different from the direction of the spontaneous-polarization axis. In addition, in the above case, the piezoelectric body can contain one or both of the following first and second domains. In the first domain, a phase transition changing a crystal system can occur when an electric field is applied to the piezoelectric body in a direction different from the direction of the spontaneous-polarization axis. The second domain has a polarization axis which can be reversibly rotated by an angle different from 180 degrees when the electric field applied to the piezoelectric body is strengthened or weakened.

US20090267998 reports realization of a phase transition in a PZT-based material from a rhombohedral crystal to a tetragonal crystal. In addition, US20080265718 reports realization of a PZT-based material having a domain configuration in which a (001)-oriented (c-axis oriented) tetragonal phase T(c), a (100)-oriented rhombohedral phase R, and a (100)-oriented (a-axis oriented) tetragonal phase T(a) are mixed when no electric field is applied to the PZT-based material, and phase transitions from the tetragonal phase T(a) through the rhombohedral phase R to the tetragonal phase T(c) occur when an electric field is applied to the PZT-based material.

As mentioned before, the perovskite oxide material according to the present invention has the composition which is realized by adding a third component to a two-component material (e.g., PZT) formed with tetragonal crystals and rhombohedral crystals, where the third component contains a crystal structure having a spontaneous-polarization axis oriented in the direction between the spontaneous-polarization axes of the tetragonal crystal and rhombohedral crystal. Therefore, in the perovskite oxide material according to the present invention, for example, a phase transition from a (001)-oriented rhombohedral phase R to a crystal phase which the third component tends to form and a phase transition from the crystal phase of the third component to a (001)-oriented tetragonal phase T(c) can occur.

In the perovskite oxide materials according to the present invention containing a plurality of third components respectively having a tendency to form crystal structures belonging to different crystal systems, it is possible to cause phase transitions between all or part of the crystal phases produced by the third components (which include the aforementioned crystal phases). In such perovskite oxide materials, the combinations of crystal systems between which phase transitions can occur differ depending on the condition concerning the application of the electric field and the domain configuration which the perovskite oxide material has when no electric field is applied.

For example, the change in the direction of the spontaneous-polarization axis occurring in the phase transitions from the (001)-oriented rhombohedral phase R to the (001)-oriented tetragonal phase T(c) through the crystal phase which the third component forms is smaller than the change in the direction of the spontaneous-polarization axis occurring in the phase transition from a (001)-oriented rhombohedral phase R to a (001)-oriented tetragonal phase T(c) in the two-component material not containing the third component. Therefore, it is possible to consider that the phase transitions from the (001)-oriented rhombohedral phase R to the (001)-oriented tetragonal phase T(c) through the crystal phase which the third component forms can occur relatively easily.

Further, the piezoelectric body formed of the perovskite oxide material according to the present invention can contain a domain in which the spontaneous-polarization axis can be reversibly rotated by an angle different from 180 degrees without causing a phase transition when an electric field is applied to the perovskite oxide material along a direction different from the direction of the spontaneous-polarization axis.

In the perovskite oxide material according to the present invention, a phase transition in a domain adjacent to a domain of the third component or a change in the direction of the spontaneous-polarization axis of the domain adjacent to the domain of the third component associated with a reversible non-180-degree domain rotation is considered to be easier to occur by the influence of a change in the spontaneous-polarization axis of the adjacent domain of the third component, since the phase transition and the change in the spontaneous-polarization axis in the domain of the third component associated with a reversible non-180-degree domain rotation can easily occur.

The molar ratio of the first, second, and third components in the perovskite oxide material according to the present invention is not specifically limited. However, the molar ratio of the first component to the second component is preferably 0.6/0.4 to 0.95/0.05, and more preferably 0.7/0.3 to 0.85/0.15. Further, in consideration that PZT exhibits high piezoelectric performance at or near the MPB (morphotropic phase boundary), it is preferable that the molar ratio of the first component to the second component in the perovskite oxide material according to the present invention be also at the value corresponding to the MPB or in the range corresponding to the vicinity of the MPB. (The vicinity of the MPB composition means the range in which phase transition occurs when an electric field is applied to the material.)

The content of the third component is not specifically limited. However, it is preferable that the content of the third component be, for example, 10 mol % or less.

Further, it is preferable that the third component contain at least one of $RMnO_3$, $BiMnO_3$, $CaTiO_3$, and $BiCrO_3$, where R denotes at least one of Sm, Eu, Gd, Tb, La, and Nd, and it is particularly preferable that the third component contain $BiMnO_3$. The third component having such composition (e.g., $TbMnO_3$ or $BiMnO_3$ having the spontaneous polarization of approximately $10^{-2}$ $\mu C/cm^2$) has a smaller magnitude of spontaneous polarization than $BaTiO_3$ (having the spontaneous polarization of approximately 25 $\mu C/cm^2$) or $BiFeO_3$ (having the spontaneous polarization of approximately 90 $\mu C/cm^2$), where the data of the spontaneous polarization are cited from "Occurrence of ferroelectricity in epitaxial $BiMnO_3$ thin films", M. Grizalez et al., Microelectronics Journal, Vol. 39, Issue 11, pp. 1308-1310, 2008, "Epitaxial $BiFeO_3$ Multiferroic Thin Film Heterostructures", J. Wang et al., Science, Vol. 299, No. 5613, pp. 1719-1722, 2003, "Giant Ferroelectric Polarization Beyond 150 $\mu C/cm^2$ in $BiFeO_3$ Thin Film", K. Y. Yun et al., Japanese Journal of Applied Physics, Vol. 43, pp. L647-L648, 2004, and "Magnetic control of ferroelectric polarization", T. Kimura et al., Nature, Vol. 426, pp. 55-58, 2003, and other literatures. Since, generally, the piezoelectric performance increases with the magnitude of spontaneous polarization, in order to increase the polarization as a whole while maintaining the effect of facilitating the polarization, it is preferable that the content of the third component be 10 mol % or less.

The perovskite oxide material according to the present invention may further contain at least one fourth component having a cubic structure or a pseudo cubic structure. It is preferable that the at least one fourth component include $SrTiO_3$. US20080278038 proposes a material containing a tetragonal phase, a rhombohedral phase, and a cubic or pseudo cubic phase. It is considered that phase transitions tend to occur in the domains surrounding each domain in the cubic or pseudo cubic phase since the B-site elements can move in the domains surrounding each domain in the cubic or pseudo cubic phase even when the strength of the applied electric field is relatively low. Therefore, it is possible to consider that in the perovskite oxide material containing domains of the cubic and pseudo cubic crystals, phase transitions first occur in the domains surrounding the domains of the cubic and pseudo cubic crystals, and exert an influence on adjacent domains, so that phase transition and/or reversible non-180-degree domain rotation in the adjacent domains becomes easier to occur.

The content of the fourth component is not specifically limited. The piezoelectric strain at low electric field strength increases with the content of the fourth component. However, there is a possibility that the piezoelectric performance is lowered when the content of the fourth component is too much, since the proportion of other components exhibiting piezoelectric characteristics is decreased by the increase in the content of the fourth component. Therefore, it is preferable that the content of the fourth component be, for example, 10 mol % or less.

Although lead-free perovskite oxide materials can be produced according to the present invention, generally, the perovskite oxide materials according to the present invention may contain lead. However, even in the case where the perovskite oxide materials according to the present invention contain lead, the lead content in the perovskite oxide materials according to the present invention can be reduced to a level lower than the lead content in the lead-containing perovskite oxides such as PZT. That is, the present invention enables reduction in the lead content.

As mentioned before, the present invention has been made by improvement on the basis of the investigation of the domain configurations in which the field-induced strain and/or the reversible non-180-degree domain rotation can easily occur. According to the present invention, it is possible to provide a lead-free or low-lead perovskite oxide material in which the field-induced strain and/or the reversible non-180-degree domain rotation can easily occur, and which can form a piezoelectric body superior in piezoelectric (ferroelectric) performance. In the case where a piezoelectric body is formed of the perovskite oxide material according to (the first aspect of) the present invention, the piezoelectric body can achieve a great piezoelectric strain even at relatively low electric field strength, since the field-induced strain and/or the reversible non-180-degree domain rotation can easily occur in the piezoelectric body.

2. Ferroelectric Compound

The ferroelectric compound according to the present invention is characterized in containing the perovskite oxide material according to the present invention, and can contain arbitrary additional components as well as the perovskite oxide material according to the present invention. The additional components may include one or more other perovskite oxides, one or more dopant elements, and a sintering assistant.

3. Piezoelectric Body

The piezoelectric body according to the present invention is characterized in being formed of the perovskite oxide material according to the present invention. (The piezoelectric body may contain inevitable impurities.) The piezoelectric body can be designed as needed, and has the form of, for example, a film or a bulk body.

The piezoelectric body according to the present invention preferably contains a ferroelectric phase having crystal orientation.

The piezoelectric strain include the following types (1) to (4):

(1) The field-induced strain (i.e., expansion and contraction along a direction in which an electric field is applied) which is produced in response to increase and decrease in the strength of the electric field when the direction of the electric field coincides with the direction of a vector component of the spontaneous polarization axis;

(2) A type of piezoelectric strain which is produced by a reversible rotation of a polarization axis by a rotation angle different from 180 degrees when increase and decrease in the strength of the electric field causes the reversible rotation;

(3) A type of piezoelectric strain which is produced by a volume change caused by a phase transition of a crystal when increase and decrease in the strength of the electric field causes the phase transition; and (4) A type of piezoelectric strain which is produced by the engineered-domain effect. The engineered-domain effect is produced in a material which has an oriented crystal structure containing a ferroelectric phase having crystal orientation along a direction different from the direction of the spontaneous-polarization axis and a characteristic of causing a phase transition in response to application of an electric field. (In the case where the engineered-domain effect is utilized, the piezoelectric body may be driven under either a condition in which phase transition occurs or a condition in which phase transition does not occur.)

It is possible to achieve a desired amount of piezoelectric strain by utilizing one or a combination of all or part of the above types (1) to (4) of piezoelectric strain. When a piezoelectric body has an oriented crystal structure suitable for realizing one or more of mechanisms by which the above types of piezoelectric strain are produced, the amount of the produced piezoelectric strain becomes great. For example, the piezoelectric body according to the present invention may contain a (100)-oriented ferroelectric phase and/or a (001)-oriented ferroelectric phase.

In the case where one or a combination of all or part of the above types (2) to (4) of piezoelectric strain is utilized, it is preferable that the piezoelectric body according to the present invention contain a ferroelectric phase having crystal orientation along a direction different from the direction of the spontaneous-polarization axis.

For example, in the system utilizing the type (4) of piezoelectric strain, it is preferable that a ferroelectric phase in which phase transition can occur have crystal orientation along a direction different from the direction of the spontaneous-polarization axis. In this case, it is particularly preferable that the ferroelectric phase in which phase transition can occur have crystal orientation in a direction approximately identical to the direction of the spontaneous-polarization axis after a phase transition. Normally, the direction of the crystal orientation is the direction of the applied electric field.

Since the piezoelectric body according to the present invention is formed of the perovskite oxide material according to the present invention, the piezoelectric body according to the present invention can contain a ferroelectric phase having crystal orientation along a direction different from the direction of the spontaneous-polarization axis, a domain in which a phase transition changing a crystal system can occur when an electric field is applied to the piezoelectric body in a direction different from the direction of the spontaneous-polarization axis, and a domain having a polarization axis which can be reversibly rotated by an angle different from 180 degrees when the electric field is strengthened or weakened.

The piezoelectric bodies which contain an oriented ferroelectric phase include oriented films (one-axis-oriented films), epitaxial films (three-axis-oriented films), and grain-oriented, sintered ceramic bodies. The oriented films can be formed under a condition enabling production of a single-axis oriented crystal, by using one of the known thin-film formation techniques including the vapor-phase techniques and the liquid-phase techniques, where the vapor-phase techniques include sputtering, MOCVD (metal organic chemical vapor deposition), plasma CVD (chemical vapor deposition), PLD (pulsed-laser deposition), discharge plasma sintering, and the like, and the liquid-phase techniques include the sol-gel technique, MOD (metal organic decomposition), and the like. The epitaxial films can be formed by using, in the substrate and the lower electrode, materials which lattice-match well with the piezoelectric body. $SrTiO_3/SrRuO_3$, MgO/Pt, and the like are preferable examples of combinations of the materials for the lower electrode and the substrate. The grain-oriented, sintered ceramic bodies can be formed by the hot-pressing technique, the sheet technique, the lamination press technique, and the like. In the lamination press technique, a plurality of sheets obtained by the sheet technique are laminated and pressed.

In consideration of reduction in the thickness and weight of the piezoelectric device in which the piezoelectric body is used, it is preferable that the piezoelectric body have the form of a film. It is more preferable that the piezoelectric body be a thin film having the thickness of 20 micrometers or smaller. The piezoelectric body is preferably an oriented film or an epitaxial film. Since the piezoelectric constant of the piezoelectric body according to the present invention is great, the piezoelectric body according to the present invention can be effectively used as a thin piezoelectric film which is required to have a great piezoelectric constant.

Since the piezoelectric body according to the present invention is formed of the perovskite oxide material according to the present invention, the field-induced strain and/or the reversible non-180-degree domain rotation can easily occur. Therefore, the piezoelectric body according to the present invention is superior in piezoelectric (ferroelectric) performance, and can produce great piezoelectric strain even at relatively low electric field strength.

3. Piezoelectric Device and Inkjet Recording Head

Hereinbelow, the structure of an inkjet recording head (as an embodiment of the liquid discharge device according to the fifth aspect of the present invention) containing a piezoelectric device (as an embodiment of the piezoelectric device according to the fourth aspect of the present invention) is explained with reference to FIG. 1, which is a cross-sectional view schematically illustrating a cross section (along the thickness direction) of an essential portion of the inkjet recording head. In FIG. 1, the dimensions of the illustrated elements are differentiated from the dimensions of the elements of the actual inkjet recording head for clarification.

In outline, the inkjet recording head 3 illustrated in FIG. 1 is constituted by a piezoelectric actuator 2 and an ink nozzle 20, and the piezoelectric actuator 2 is constituted by a piezoelectric device 1 and a diaphragm 16.

The the piezoelectric device 1 is produced by forming on a substrate 11 a lower electrode 12, a piezoelectric body 13, and an upper electrode 14 in this order. The piezoelectric body 13 is a film formed of the perovskite oxide material according to the present invention. (The piezoelectric body 13 may contain inevitable impurities.)

The material for the substrate 11 is not specifically limited. For example, the substrate 11 may be made of one of silicon, glass, stainless steel, YSZ (yttrium stabilized zirconia), alumina, sapphire, silicon carbide, various types of monocrystalline oxides, and the like. In addition, the substrate 11 may be realized by a laminated substrate such as the SOI (silicon-on-insulator) substrate, which is produced by forming on a surface of a silicon substrate an oxide film of $SiO_2$ and a Si active layer in this order. The various types of monocrystalline oxides include, for example, strontium titanate ($SrTiO_3$), neodymium gallate ($NdGaO_3$), lanthanum aluminate ($LaAlO_3$), and magnesium oxide (MgO).

In addition, the main component of the lower electrode 12 is not specifically limited, and may be, for example, one or a combination of metals such as Au, Pt, and Ir and metal oxides such as $IrO_2$, $RuO_2$, $LaNiO_3$, and $SrRuO_3$. Further, the main component of the upper electrodes 14 is not specifically limited, and may be, for example, one or a combination of the same materials as the examples of the main component of the lower electrode 12 and other materials (such as Al, Ta, Cr, or Cu) which are generally used in the electrodes in the semiconductor processes. Although the thicknesses of the lower electrode 12 and the upper electrodes 14 are not specifically limited, it is preferable that the thicknesses of the lower electrode 12 and the upper electrodes 14 be 50 to 500 nm.

The piezoelectric actuator 2 is produced by attaching the diaphragm 16 to the back surface of the substrate 11 of the piezoelectric device 1 so that the diaphragm 16 can vibrate in correspondence with expansion and contraction of the piezoelectric body 13. In addition, the piezoelectric actuator 2 comprises a control means 15 (such as a driver circuit) for driving the piezoelectric device 1.

The inkjet recording head 3 is produced by attaching the ink nozzle 20 to the back surface of the piezoelectric actuator 2. The ink nozzle 20 is a member for reserving and discharging ink, and comprises an ink chamber 21 (as the liquid-reserve chamber) and an ink-discharge outlet 22 (as the liquid-discharge outlet). The ink chamber 21 reserves the ink, and the ink held in the ink chamber 21 is discharged out of the ink chamber 21 through the corresponding ink-discharge outlet.

In the above inkjet recording head 3, the strength of the electric field applied to the piezoelectric device 1 is increased or decreased so as to expand or contract the piezoelectric device 1 and control the discharge of the ink from the ink chamber 21 and the discharge amount of the ink.

Alternatively, it is possible to machine or process portions of the substrate 11 so as to form the diaphragm 16 and the ink nozzle 20, instead of separately preparing the diaphragm 16 and the ink nozzle 20 and attaching the diaphragm 16 and the ink nozzle 20 to the piezoelectric device 1. For example, the ink chamber 21 can be formed by etching a corresponding portion of the substrate 11 from the bottom surface of the substrate 11, and the diaphragm 16 and the structures of the ink nozzle 20 can be produced by machining or processing the substrate 11 per se.

Since the piezoelectric device 1 illustrated in FIG. 1 comprises the piezoelectric film (ferroelectric film) 13 according to the present invention, the perovskite-oxide lamination 1 contains a perovskite oxide which is theoretically considered able to exhibit high piezoelectric performance and has been conventionally unable to be formed into a perovskite structure at normal pressure, is superior in the piezoelectric (ferroelectric) performance, and reduces the environmental load.

4. Inkjet Recording Apparatus

Figure 2:
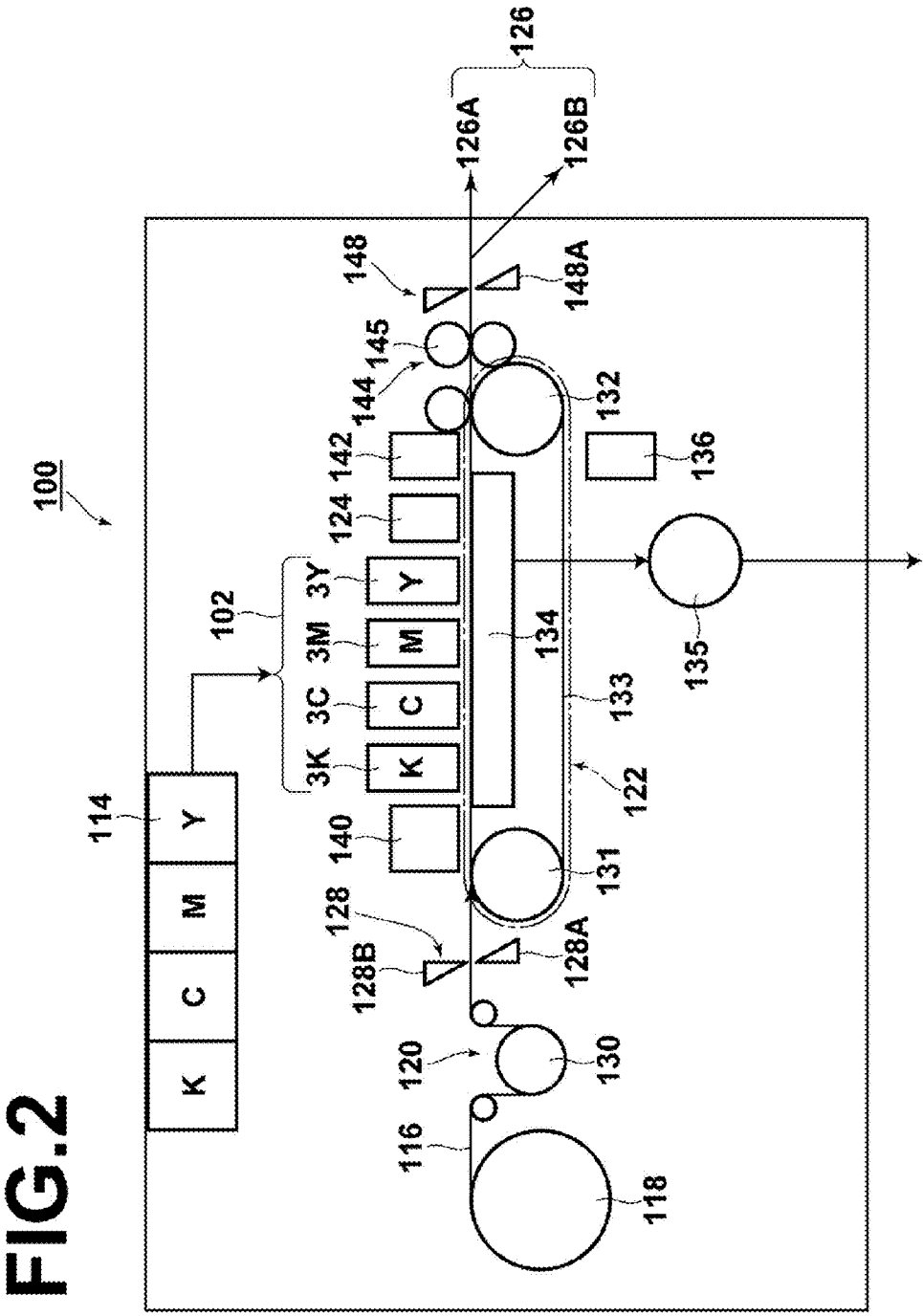
FIG. 2 is a schematic diagram of an example of an inkjet recording apparatus using the inkjet recording head of FIG. 1.
Figure 3:
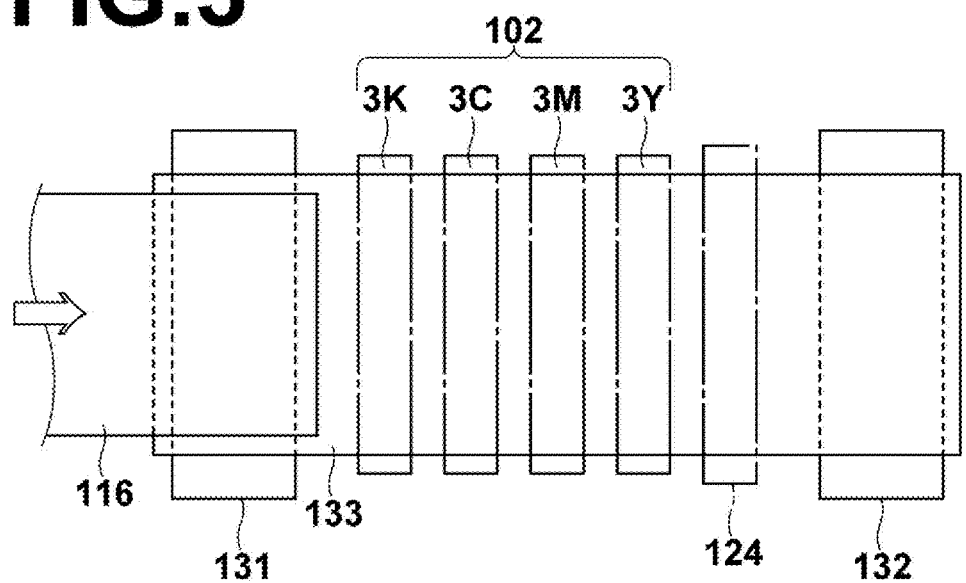
FIG. 3 is a top view of a portion of the inkjet recording apparatus of FIG. 2.

Hereinbelow, an example of an inkjet recording apparatus having the inkjet recording head 3 is explained with reference to FIGS. 2 and 3. FIG. 2 is a schematic diagram illustrating an outline of an example of an inkjet recording apparatus having the inkjet recording head 3 of FIG. 2, and FIG. 3 is a top view of a portion of the inkjet recording apparatus of FIG. 2.

As schematically illustrated in FIG. 2, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head 3 according to the present embodiment as explained before. In order to realize a linear head (explained later), each inkjet recording head used in the inkjet recording apparatus 100 comprises a plurality of ink chambers and a plurality of ink-discharge outlets.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120 as illustrated in FIG. 2. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 2, and the recording sheet 116 held on the endless belt 133 is moved from left to right in FIG. 2.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 3. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 3. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises pressure rollers 145 having a surface having predetermined projections and depressions, and transfers the predetermined projections and depressions to the printed surface of the recording sheet 116 by pressing the printed surface with the pressure rollers 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

5. Concrete Examples

The present inventors have produced concrete examples of piezoelectric films according to the present invention and a comparison example as indicated below.

5.1 Concrete Example 1

The concrete example 1 of the piezoelectric film according to the present invention has been produced and evaluated as follows.

5.1.1 Formation of Buffer Layer and Lower Electrode

A (100) substrate of silicon having the thickness of 500 micrometers has been prepared, and the natural oxide film on the surface of the Si substrate has been removed. Then, a buffer layer of MgO having the thickness of approximately 20 nanometers and a lower electrode of $SrRuO_3$ (SRO) having the thickness of approximately 200 nanometers have been formed on the surface of the substrate by PLD (pulsed-laser deposition). Details of the film formation conditions for the buffer layer and the lower electrode are as follows.

Condition for Buffer Layer:
Target: a commercially available Mg metal target
Substrate Temperature: 400° C.
Oxygen Partial Pressure: 1 mTorr (=0.13 Pa)
Laser Intensity: 300 mJ
Laser Pulse Frequency: 5 Hz
Substrate-target Distance: 50 mm
Rotation Speed of Target: 9.7 rpm
Film-formation Time: approximately 2 minutes
Condition for Lower Electrode:
Target: a commercially available SRO target
Substrate Temperature: 700° C.
Oxygen Partial Pressure: 10 mTorr (=1.3 Pa)
Laser Intensity: 300 mJ Laser Pulse Frequency: 5 Hz
Substrate-target Distance: 50 mm
Rotation Speed of Target: 9.7 rpm
Film-formation Time: approximately 10 minutes 5.1.2 Formation of Piezoelectric Film Subsequently, a piezoelectric film of (Ba, Bi) (Ti, Fe, Mn)$O_3$ having the thickness of 2 micrometers has been formed on the SRO lower electrode by PLD at the substrate temperature of 580° C. and the oxygen partial pressure of 50 mTorr. Specifically, a plurality of samples S1-1 to S1-10 with different compositions of the piezoelectric film have been produced on the identical laminations of the substrate, the buffer layer, and the lower electrode by using a plurality of targets respectively having compositions for realizing the different compositions of the piezoelectric films in the samples S1-1 to S1-10. The compositions of the plurality of targets for the respective samples S1-1 to S1-10 are indicated in Table 1.

The above targets have been prepared by measuring commercially available powers of $BaTiO_3$, $BiFeO_3$, and $Mn_2O_3$ so as to realize desired proportions, and mixing the measured powers in a mortar and a ball mill until a uniform mixture is obtained. In order to compensate for a proportion of Bi which is expected to be volatilized during the sintering and the film formation, the Bi composition in the used power of $BiFeO_3$ is 10% higher than the stoichiometric composition.

5.1.3 XRD Analysis

Figure 4A:
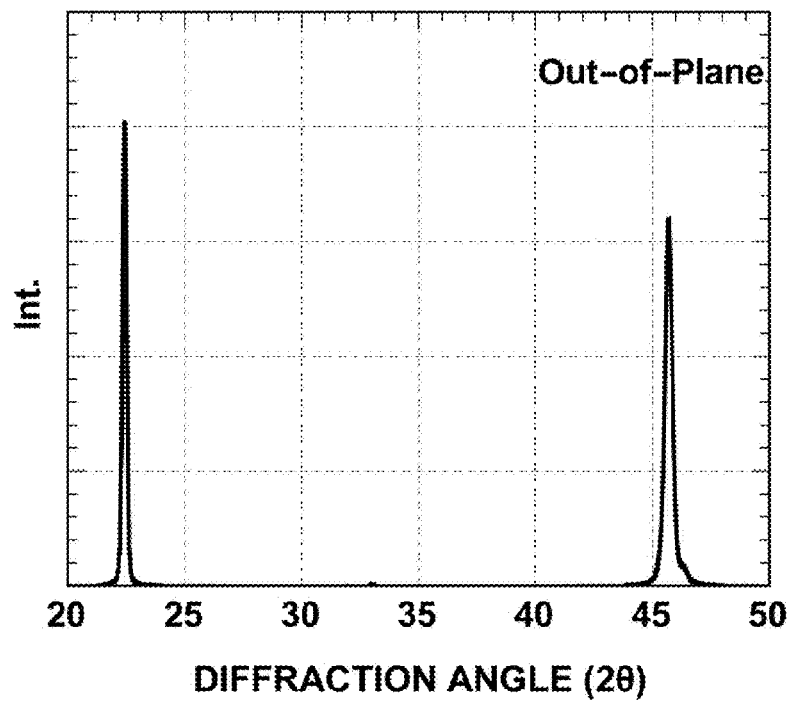
FIG. 4A is a graph indicating an out-of-plane XRD (X-ray Diffraction) profile of a piezoelectric film in a concrete example 1.
Figure 4B:
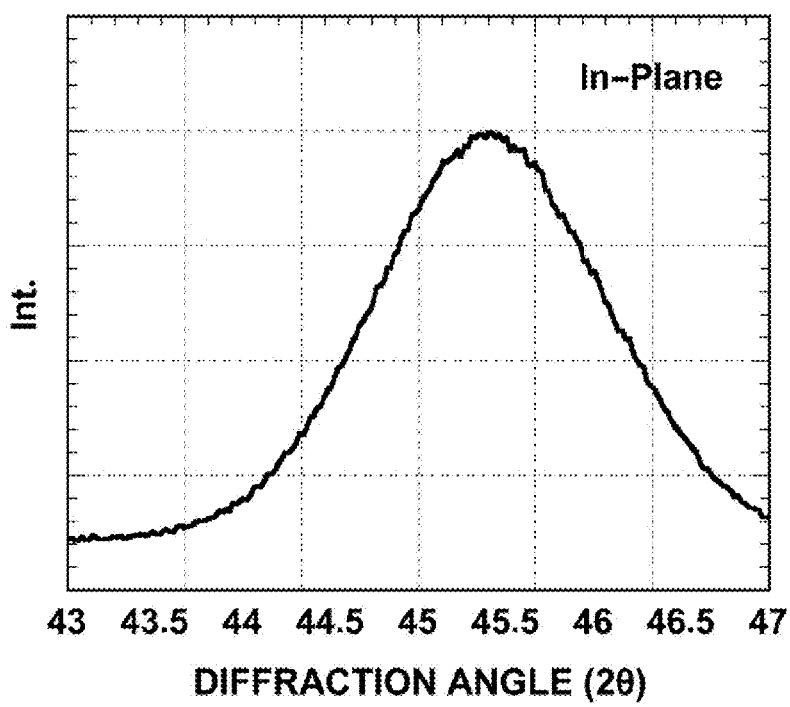
FIG. 4B is a graph indicating an in-plane XRD (X-ray Diffraction) profile of the piezoelectric film in the concrete example 1.
Figure 5:
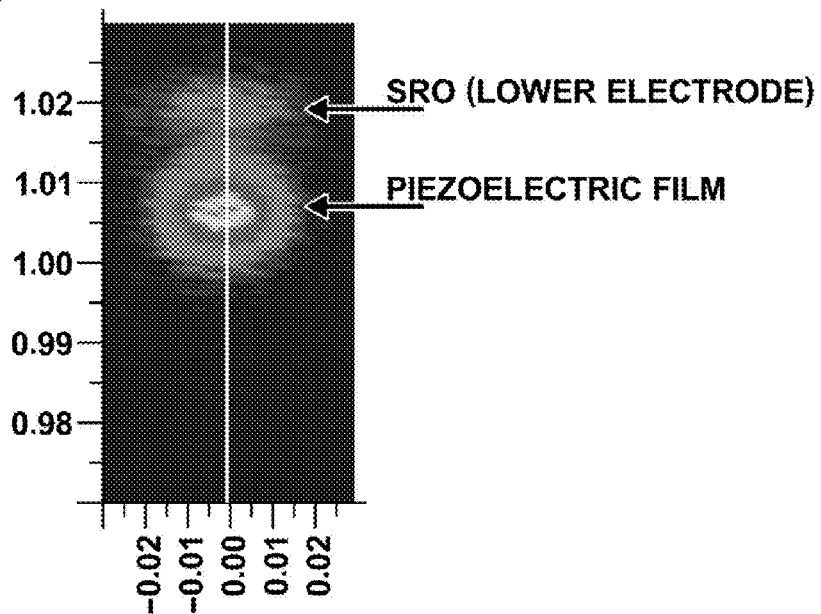
FIG. 5 is a (004) reciprocal space map of the piezoelectric film in the concrete example 1, which is obtained by XRD.

The crystal structures of the piezoelectric films formed as above have been analyzed by XRD (X-ray Diffraction). The results of the XRD analysis are indicated in the FIGS. 4A, 4B, and 5. FIGS. 4A and 4B respectively indicate the results of an out-of-plane XRD measurement and an in-plane XRD measurement of the sample S1-7, and FIG. 5 is a (004) reciprocal space map of the piezoelectric film, which has been obtained by XRD.

In the out-of-plane XRD profile indicated in FIG. 4A, only the peaks corresponding to the reflections from the (100) and (200) planes have been observed. That is, a growth of the piezoelectric film oriented along the thickness direction has been confirmed. In the in-plane XRD profile indicated in FIG. 4B, only the peak corresponding to the reflection from the (002) plane has been observed. That is, a growth of the piezoelectric film oriented in an in-plane direction has also been confirmed. In the reciprocal space map indicated in FIG. 5, a spotlike diffraction pattern, which indicates that the obtained piezoelectric film is an epitaxial film, has been observed. That is, it has been confirmed that the obtained piezoelectric film is an epitaxial film. Similar results of XRD analysis have also been obtained for the other samples S1-1 to S1-6 and S1-8 to S1-10.

5.1.4 ICP Analysis

The compositions of the targets and the piezoelectric films in the respective samples have been analyzed by inductively coupled plasma (ICP). For example, the compositions of the target and the piezoelectric film in the sample S1-6 have been measured as follows.

Composition of Target:
$(Ba_{0.2}Bi_{0.8})(Ti_{0.19}Fe_{0.76}Mn_{0.05})O_3$
Composition of Piezoelectric Film:
$(Ba_{0.22}Bi_{0.78})(Ti_{0.17}Fe_{0.79}Mn_{0.04})O_3$ That is, the difference in the composition between the target and the piezoelectric film in the sample S1-6 is 5% or smaller. The difference in the composition between the target and the piezoelectric film in each of the other samples S1-1 to S1-5 and S1-7 to S1-10 is 5% or smaller.

5.1.5 Evaluation of Piezoelectric Performance

Finally, an upper electrode of Pt having the thickness of 100 nanometers has been formed on the piezoelectric film in each sample by sputtering. Thus, production of a piezoelectric device has been completed. Thereafter, a cantilever (having the dimensions of 15 mm×2.5 mm and the thickness of 0.5 mm) is formed with the piezoelectric device in each sample, and the displacement of the tip of the cantilever when a voltage of 50 V is applied to the piezoelectric device has been measured. The values of the displacement obtained by the measurement of the samples S1-1 to S1-10 are also indicated in Table 1.

TABLE 1

Target Composition and Displacement (Concrete Example 1)

| Piezoelectric Film | Target Composition | Displacement (μm) |
|---|---|---|
| S1-1 | $Ba(Ti_{0.95}Mn_{0.05})O_3$ | 0.96 |
| S1-2 | $(Ba_{0.5}Bi_{0.5})(Ti_{0.47}Fe_{0.48}Mn_{0.05})O_3$ | 0.98 |
| S1-3 | $(Ba_{0.4}Bi_{0.6})(Ti_{0.38}Fe_{0.57}Mn_{0.05})O_3$ | 1.03 |
| S1-4 | $(Ba_{0.3}Bi_{0.7})(Ti_{0.29}Fe_{0.66}Mn_{0.05})O_3$ | 1.32 |
| S1-5 | $(Ba_{0.25}Bi_{0.75})(Ti_{0.24}Fe_{0.71}Mn_{0.05})O_3$ | 1.56 |
| S1-6 | $(Ba_{0.2}Bi_{0.8})(Ti_{0.19}Fe_{0.76}Mn_{0.05})O_3$ | 1.73 |
| S1-7 | $(Ba_{0.15}Bi_{0.85})(Ti_{0.14}Fe_{0.81}Mn_{0.05})O_3$ | 1.70 |
| S1-8 | $(Ba_{0.1}Bi_{0.9})(Ti_{0.1}Fe_{0.85}Mn_{0.05})O_3$ | 1.08 |
| S1-9 | $(Ba_{0.05}Bi_{0.95})(Ti_{0.05}Fe_{0.9}Mn_{0.05})O_3$ | 0.98 |
| S1-10 | $Bi(Fe_{0.95}Mn_{0.05})O_3$ | 0.84 |

5.2 Concrete Example 2

A plurality of samples S2-4 to S2-8 of the concrete example 2 of the piezoelectric film according to the present invention have been produced and evaluated in a similar manner to the samples S1-4 to S1-8 of the concrete example 1. The samples S2-4 to S2-8 of the concrete example 2 have been produced in correspondence with the samples S1-4 to S1-8 of the concrete example 1. The compositions of the samples S2-4 to S2-8 of the concrete example 2 differ from the corresponding samples S1-4 to S1-8 of the concrete example 1 in that 10 mol % of $SrTiO_3$ (STO) is added in the samples of the concrete example 2. The compositions of the targets used for formation of the piezoelectric films in the respective samples S2-4 to S2-8 of the concrete example 2 and the values of displacement obtained by the measurement of the samples S2-4 to S2-8 are indicated in Table 2.

TABLE 2

Target Composition and Displacement (Concrete Example 2)

| Piezoelectric Film | Target Composition | Displacement (μm) |
|---|---|---|
| S2-4 | S1-4 + 10 mol % STO $(Ba_{0.27}Bi_{0.63}Sr_{0.1})(Ti_{0.36}Fe_{0.59}Mn_{0.05})O_3$ | 1.45 |
| S2-5 | S1-5 + 10 mol % STO $(Ba_{0.22}Bi_{0.68}Sr_{0.1})(Ti_{0.31}Fe_{0.64}Mn_{0.05})O_3$ | 1.78 |
| S2-6 | S1-6 + 10 mol % STO $(Ba_{0.18}Bi_{0.72}Sr_{0.1})(Ti_{0.27}Fe_{0.68}Mn_{0.05})O_3$ | 2.06 |
| S2-7 | S1-7 + 10 mol % STO $(Ba_{0.13}Bi_{0.77}Sr_{0.1})(Ti_{0.23}Fe_{0.73}Mn_{0.04})O_3$ | 2.08 |
| S2-8 | S1-8 + 10 mol % STO $(Ba_{0.1}Bi_{0.8}Sr_{0.1})(Ti_{0.19}Fe_{0.77}Mn_{0.04})O_3$ | 1.52 |

5.3 Concrete Example 3

A plurality of samples S3-2 to S3-9 of the concrete example 3 of the piezoelectric film according to the present invention have been produced and evaluated in a similar manner to the concrete example 1. The compositions of the targets used for formation of the piezoelectric films in the respective samples S3-2 to S3-9 of the concrete example 3 and the values of displacement obtained by the measurement of the samples S3-2 to S3-9 of the concrete example 3 are indicated in Table 3.

TABLE 3

| Piezoelectric Film | Target Composition (%) | | | Displacement (μm) |
|---|---|---|---|---|
| | 1st Component BiFeO$_3$ | 2nd Component BaTiO$_3$ | 3rd Component BiMnO$_3$ | |
| S3-2 | 47.5 | 47.5 | 5 | 1.01 |
| S3-3 | 57 | 38 | 5 | 1.06 |
| S3-4 | 66.5 | 28.5 | 5 | 1.41 |
| S3-5 | 71.25 | 23.75 | 5 | 1.62 |
| S3-6 | 76 | 19 | 5 | 1.91 |
| S3-7 | 80.75 | 14.25 | 5 | 1.87 |
| S3-8 | 85.5 | 9.5 | 5 | 1.15 |
| S3-9 | 90.25 | 4.75 | 5 | 1.02 |

5.4 Concrete Example 4

A plurality of samples S4-3 to S4-8 of the concrete example 4 of the piezoelectric film according to the present invention have been produced and evaluated in a similar manner to the concrete example 1. The samples S4-3 to S4-8 of the concrete example 4 have been produced in correspondence with the samples S3-3 to S3-8 of the concrete example 3. The compositions of the samples S4-3 to S4-8 of the concrete example 4 differ from the corresponding samples S3-3 to S3-8 of the concrete example 3 in that 10 mol % of SrTiO$_3$ (STO) is added in the samples of the concrete example 4. The compositions of the targets used for formation of the piezoelectric films in the respective samples S4-3 to S4-8 of the concrete example 4 and the values of displacement obtained by the measurement of the samples S4-3 to S4-8 are indicated in Table 4.

TABLE 4

| Piezoelectric Film | Target Composition (%) | | | | Displacement (μm) |
|---|---|---|---|---|---|
| | 1st Component BiFeO$_3$ | 2nd Component BaTiO$_3$ | 3rd Component BiMnO$_3$ | 4th Component SrTiO$_3$ | |
| S4-3 | 51.3 | 34.2 | 4.5 | 10 | 1.18 |
| S4-4 | 59.85 | 25.65 | 4.5 | 10 | 1.55 |
| S4-5 | 64.125 | 21.375 | 4.5 | 10 | 1.91 |
| S4-6 | 68.4 | 17.1 | 4.5 | 10 | 2.21 |
| S4-7 | 72.675 | 12.825 | 4.5 | 10 | 2.24 |
| S4-8 | 79.65 | 8.55 | 4.5 | 10 | 1.64 |

5.5 Concrete Example 5

A plurality of samples S5-3 to S5-8 of the concrete example 5 of the piezoelectric film according to the present invention have been produced and evaluated in a similar manner to the concrete example 1. The samples S5-3 to S5-8 of the concrete example 5 have been produced in correspondence with the samples S3-3 to S3-8 of the concrete example 3. The compositions of the samples S5-3 to S5-8 of the concrete example 5 differ from the corresponding samples S3-3 to S3-8 of the concrete example 3 in that 5 mol % of CaTiO$_3$ is added in the samples of the concrete example 5. The compositions of the targets used for formation of the piezoelectric films in the respective samples S5-3 to S5-8 of the concrete example 5 and the values of displacement obtained by the measurement of the samples S5-3 to S5-8 are indicated in Table 5.

TABLE 5

| Piezoelectric Film | Target Composition (%) | | | | Displacement (μm) |
|---|---|---|---|---|---|
| | 1st Component BiFeO$_3$ | 2nd Component BaTiO$_3$ | 3rd Component(1) BiMnO$_3$ | 3rd Component(2) CaTiO$_3$ | |
| S5-5 | 67.6875 | 22.5625 | 4.75 | 5 | 1.72 |
| S5-6 | 72.2 | 18.05 | 4.75 | 5 | 2.03 |

TABLE 5-continued

| | Target Composition (%) | | | | |
|---|---|---|---|---|---|
| Piezoelectric Film | 1st Component $BiFeO_3$ | 2nd Component $BaTiO_3$ | 3rd Component(1) $BiMnO_3$ | 3rd Component(2) $CaTiO_3$ | Displacement (μm) |
| S5-7 | 76.7125 | 13.5375 | 4.75 | 5 | 2.06 |
| S5-8 | 81.225 | 9.025 | 4.75 | 5 | 1.32 |

5.6 Comparison Example

A plurality of samples RS1-1 to RS1-4, RS1-6, RS1-8, and RS1-10 of a comparison example of the piezoelectric film have been produced and evaluated in a similar manner to the samples S1-1 to S1-4, S1-6, S1-8, and S1-10 of the concrete example 1. The compositions of the samples RS1-1 to RS1-4, RS1-6, RS1-8, and RS1-10 of the comparison example have been produced in correspondence with the samples S1-1 to S1-4, S1-6, S1-8, and S1-10 of the concrete example 1, and the compositions of the samples RS1-1 to RS1-4, RS1-6, RS1-8, and RS1-10 of the comparison example differ from the corresponding samples S1-1 to S1-4, S1-6, S1-8, and S1-10 of the concrete example 1 in that $BiMnO_3$ is not added in the samples RS1-1 to RS1-4, RS1-6, RS1-8, and RS1-10 of the comparison example. The compositions of the targets used for formation of the piezoelectric films in the respective samples RS1-1 to RS1-4, RS1-6, RS1-8, and RS1-10 of the comparison example and the values of displacement obtained by the measurement of samples RS1-1 to RS1-4, RS1-6, RS1-8, and RS1-10 are indicated in Table 6, although the measurement of the displacement in the samples RS1-8 and RS1-10 has been found to be impossible due to leakage current.

TABLE 6

Target Composition and Displacement (Comparison Example)

| Piezoelectric Film | Target Composition | Displacement (μm) |
|---|---|---|
| RS1-1 | $BaTiO_3$ | 0.92 |
| RS1-2 | $(Ba_{0.5}Bi_{0.5})(Ti_{0.5}Fe_{0.5})O_3$ | 0.90 |
| RS1-3 | $(Ba_{0.4}Bi_{0.6})(Ti_{0.4}Fe_{0.6})O_3$ | 0.86 |
| RS1-4 | $(Ba_{0.3}Bi_{0.7})(Ti_{0.3}Fe_{0.7})O_3$ | 0.99 |
| RS1-6 | $(Ba_{0.2}Bi_{0.8})(Ti_{0.2}Fe_{0.8})O_3$ | 1.23 |
| RS1-8 | $(Ba_{0.1}Bi_{0.9})(Ti_{0.1}Fe_{0.9})O_3$ | Unmeasurable |
| RS1-10 | $BiFeO_3$ | Unmeasurable |

5.7 Summary of the Evaluation

Figure 6:
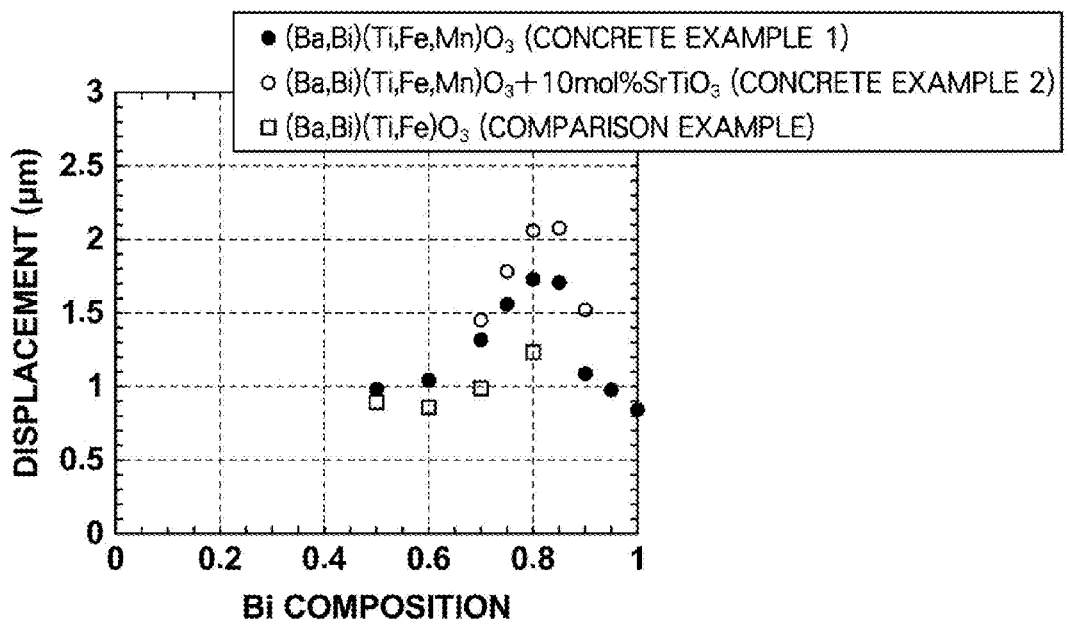
FIG. 6 is graph indicating a relationship between the composition and the displacement in each of the concrete examples 1 and 2 and a comparison example.

The relationship between the composition and the displacement in each of the concrete examples 1 and 2 and the comparison example which has been obtained as above is plotted in FIG. 6. In addition, the relationship between the composition and the displacement in each of the concrete examples 3 and 4 and the comparison example which has been obtained as above is plotted in FIG. 7.

6. Industrial Usability

The perovskite oxide material according to the present invention can be preferably used in piezoelectric elements, piezoelectric vibration generators, ferroelectric memories (FRAMs), and other devices, where the piezoelectric elements can be mounted in inkjet recording heads, magnetic recording-and-reproduction heads, MEMS (micro electromechanical systems) devices, micropumps, ultrasonic probes, and the like.

What is claimed is:

1. A perovskite oxide material containing:
   $BiFeO_3$ as a first component;
   a second component containing at least one perovskite oxide which is constituted by A-site atoms having an average ionic valence of two and has a tendency to form a tetragonal structure; and
   a third component containing at least one perovskite oxide which has a tendency to form one of monoclinic, triclinic, and orthorhombic structures.

2. The perovskite oxide material according to claim 1, wherein said second component contains at least one of $BaTiO_3$, (Bi, K) $TiO_3$, and $SnTiO_3$.

3. The perovskite oxide material according to claim 2, wherein said second component contains $BaTiO_3$.

4. The perovskite oxide material according to claim 1, wherein said third component forms at least one of a monoclinic structure and a triclinic structure.

5. The perovskite oxide material according to claim 1, wherein said third component contains at least one of $RMnO_3$, $BiMnO_3$, $CaTiO_3$, and $BiCrO_3$, and R denotes at least one of Sm, Eu, Gd, Tb, La, and Nd.

6. The perovskite oxide material according to claim 5, wherein said third component contains $BiMnO_3$.

7. The perovskite oxide material according to claim 1, wherein said first component and said second component are in a molar ratio at or near a morphotropic phase boundary.

8. The perovskite oxide material according to claim 1, containing 10% or less of said third component.

9. The perovskite oxide material according to claim 1, wherein the molar ratio of said first component to said second component is 0.6/0.4 to 0.95/0.05.

10. The perovskite oxide material according to claim 1, further containing at least one fourth component having one of a cubic structure and a pseudo cubic structure.

11. The perovskite oxide material according to claim 10, wherein said at least one fourth component contains $SrTiO_3$.

12. A ferroelectric compound containing said perovskite oxide material according to claim 1.

13. A piezoelectric body containing said perovskite oxide material according to claim 1.

14. The piezoelectric body according to claim 13, having a form of a film.

15. The piezoelectric body according to claim 14, having crystal orientation.

16. The piezoelectric body according to claim 15, containing at least one of a (100)-oriented portion and a (001)-oriented portion.

17. The piezoelectric body according to claim 15, containing a ferroelectric phase which has crystal orientation along a direction different from a direction of a spontaneous-polarization axis.

18. The piezoelectric body according to claim 17, containing a domain in which phase transition changing a crystal system can occur when an electric field is applied to the piezoelectric body in a direction different from the direction of the spontaneous-polarization axis, and/or a domain having a polarization axis which can be reversibly rotated by an angle different from 180 degrees when the electric field is strengthened or weakened.

19. A piezoelectric device comprising:
   a piezoelectric body according to claim 13; and
   electrodes through which an electric field can be applied to the piezoelectric body.

20. A liquid discharge device comprising:
   said piezoelectric device according to claim 19; and
   a discharge member being arranged adjacent to the piezoelectric device, and including,
      a liquid-reserve chamber which reserves liquid, and
   a liquid-discharge outlet arranged to externally discharge said liquid in response to application of an electric field to said piezoelectric body in the piezoelectric device.

* * * * *